United States Patent [19]
Bareither et al.

[11] Patent Number: 5,731,635
[45] Date of Patent: Mar. 24, 1998

[54] SEMICONDUCTOR DEVICE HAVING A CARRIER AND A MULTILAYER METALLIZATION

[75] Inventors: Wolfgang Bareither, Hamburg; Harald Schröder, Schenefeld; Dieter Tommalla, Elmshorn, all of Germany

[73] Assignee: U.S. Philips Corporation, New York, N.Y.

[21] Appl. No.: 692,852

[22] Filed: Jul. 24, 1996

[30] Foreign Application Priority Data

Jul. 27, 1995 [DE] Germany ............ 195 27 209.9

[51] Int. Cl.⁶ .................................................. H01L 23/48
[52] U.S. Cl. .................................... 257/763; 257/765
[58] Field of Search .......................... 257/763, 765, 257/766, 769

[56] References Cited

U.S. PATENT DOCUMENTS

| | | | |
|---|---|---|---|
| 4,480,261 | 10/1984 | Hattori et al. | 257/766 |
| 4,772,935 | 9/1988 | Lawler et al. | 257/782 |
| 4,954,870 | 9/1990 | Takemura et al. | 257/766 |
| 5,053,846 | 10/1991 | Morizuka | 257/660 |

*Primary Examiner*—Sara W. Crane
*Assistant Examiner*—Roy Potter
*Attorney, Agent, or Firm*—Brian J. Wieghaus

[57] ABSTRACT

A semiconductor device has a carrier, at least one semiconductor component provided on this carrier, and a multilayer metallization between the semiconductor component and the carrier. A first metal layer of aluminium, gold, or a gold alloy is provided on the surface of the semiconductor component, a second metal layer of titanium is provided on the first metal layer, a third metal layer of nickel is provided on the second metal layer, and a fourth metal layer of a binary or ternary gold-germanium alloy is provided on the third metal layer. The device has a low-ohmic contact resistance and extremely long useful life under temperature loads.

11 Claims, 1 Drawing Sheet

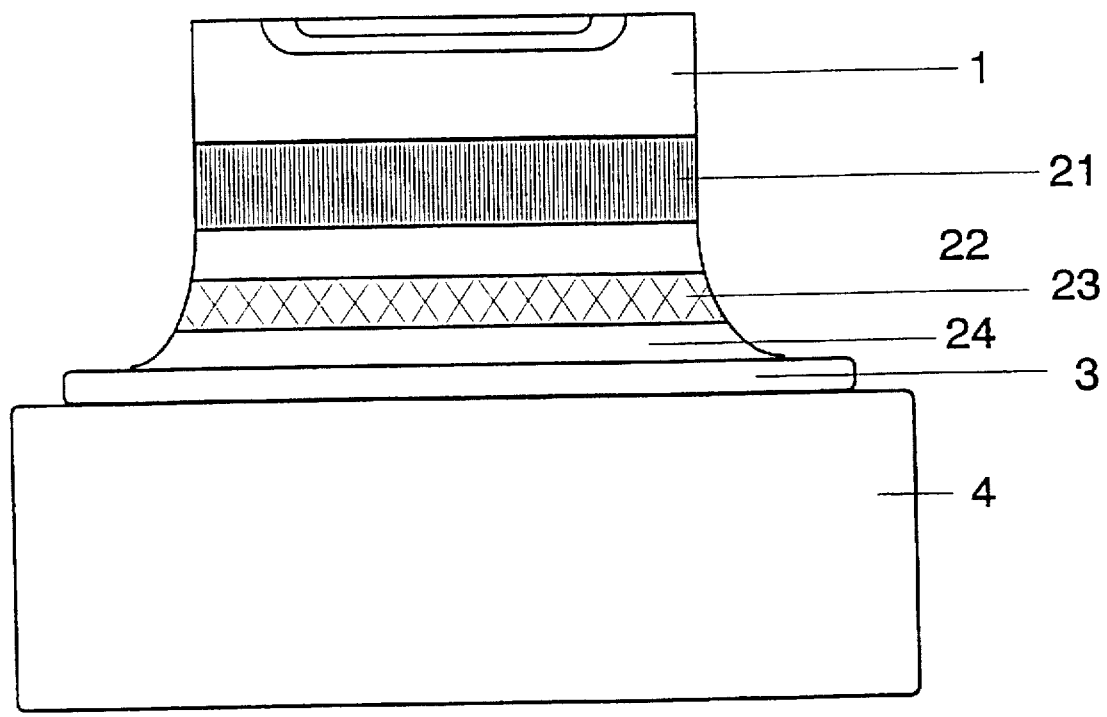

SEMICONDUCTOR DEVICE HAVING A CARRIER AND A MULTILAYER METALLIZATION

BACKGROUND OF THE INVENTION

The invention relates to a semiconductor device which comprises a carrier, at least one semiconductor component provided thereon, and a multilayer metallization between the semiconductor component and the carrier.

Discrete semiconductor components, for example transistors and systems of transistors combined with other components, for example digital transistors, diodes, sensors, resistors, or small capacitances are manufactured as a first step in the manufacture of semiconductor devices. Several thousands of such discrete components are for this purpose manufactured simultaneously on a silicon wafer.

The silicon wafer is subsequently cut up into individual transistor systems or chips. Each of the systems is fastened on a carrier, provided with electrical connection lines, and incorporated in a package. The incorporated transistors, diodes, etc. with their packages are then soldered in circuits or assemblies.

It is important for a satisfactory operation of a discrete semiconductor component or IC that a good electrical and thermal contact obtains between the component body, the electrodes, the carrier, the package, and the connection lines. It is in particular a problem to manufacture non-rectifying metal-semiconductor contacts for connecting the semiconductor zones to the electrodes and the external electrical lines in the case of diodes, transistors, etc.

The metal-semiconductor contacts may be either ohmic contacts or rectifying contacts. Which of the two contacts is created depends on the nature of the contact material used, the manufacturing technique, and further factors. In an ohmic connection, the total current value is independent of the polarity of the applied voltage. The current through a rectifying contact on the other hand depends on the direction of the applied field.

In addition, a good mechanical connection between package and component must be made.

Various processes are known for fastening a silicon semiconductor element on a carrier or chip fastening component by means of a multilayer metallization which at the same time forms an electrode.

DE 29 30 779 discloses a semiconductor device which comprises a carrier, a semiconductor component provided on this carrier, and between the semiconductor component and the carrier a metal layer comprising gold and germanium, while a first metal layer made of a metal from the group vanadium, aluminium, titanium, chromium, molybdenum and a nickel-chromium alloy is provided on a surface of the semiconductor component, on this first metal layer a second metal layer is provided made of a metal from the group copper, copper alloy, nickel and nickel alloy, and the metal layer comprising gold and germanium and made from a gold-germanium alloy or an alloy on the basis of gold-germanium is provided on said second metal layer.

In these connection layers, however, diffusion processes in the metallization layer may lead to complications which manifest themselves in a too short life, especially at higher operational temperatures. In addition, the contact between the semiconductor and the metallization is insufficient.

SUMMARY OF THE INVENTION

It is an object of the invention to provide a semiconductor device which comprises a carrier, at least one semiconductor component provided thereon, and a multilayer metallization between the semiconductor component and the carrier, and which forms a durable electrical, mechanical, and thermal contact between the semiconductor component, the metallization, and the carrier with an improved long-term stability.

According to the invention, this object is achieved by means of a semiconductor device comprising a carrier, at least one semiconductor component provided thereon, and a multilayer metallization between the semiconductor component and the carrier, wherein a first metal layer of aluminium, gold, or a gold alloy is provided on the surface of the semiconductor component, a second metal layer of titanium is provided on the first metal layer, a third metal layer of nickel is provided on the second metal layer, and a fourth metal layer made of a binary or ternary gold-germanium alloy is provided on the third metal layer.

Such a semiconductor device is found to have an extremely long useful life. No or only minor ageing occurs in the contact zone even at higher temperatures, so that such a semiconductor device is suitable for use in ambient temperatures of up to 150° C. such as occur, for example, in automobile applications.

According to the invention, the semiconductor component is preferably a PNP transistor and the first metal layer is made of gold. This semiconductor device has a low-ohmic contact layer and a strongly improved useful life.

It is particularly preferred in the present invention that the semiconductor component is an NPN transistor or a PN diode, and the first metal layer consists of a gold-arsenic alloy.

This arrangement leads to the creation of the same type of charge carrier at the transition between the metallization and the semiconductor component under thermal influences which is also found in the semiconductor in this location. The transition as a result is low-ohmic and without barrier layer characteristics, i.e. without rectifying action.

It may also be preferable that the first metal layer has a layer thickness of 0.1 to 0.5 µm, the second metal layer a layer thickness from 0.5 to 0.3 µm, the third metal layer a layer thickness from 0.05 to 0.5 µm, and the fourth metal layer a layer thickness from 0.5 to 5 µm in the semiconductor device.

BRIEF DESCRIPTION OF THE DRAWING

The invention will be explained in more detail below with reference to a drawing, and examples will be given.

In the drawing:

FIG. 1 shows a semiconductor device according to the present invention in cross-section.

DESCRIPTION OF THE PREFERRED EMBODIMENTS

The semiconductor device according to the invention comprises a semiconductor component 1, which may be a discrete bipolar transistor, in particular a planar transistor or field effect transistor, or alternatively a semiconductor diode, in particular a junction diode or Schottky diode, or also a sensor component or combination of a transistor with other components, for example a digital transistor. These or other semiconductor components are soldered on a carrier or chip fastening part 4, which supports a further metal layer 3, by means of a multilayer metallization 21, 22, 23, 24 which at the same time forms the collector electrode, and are subsequently incorporated in a package. The device can be used for mounting on printed circuit boards, etc. after it has been provided with electrical connection lines.

The semiconductor components 1 are manufactured mainly from silicon. In the case of discrete components, this is usually a thin, doped silicon wafer with a layer thickness of 0.05 to 0.6 mm and an area of 0.02 to 20 mm$^2$.

The first metallization layer 21 is made of aluminium, gold, or a gold alloy, depending on whether the adjoining layer of the component, for example the collector layer of a transistor, is P-type or N-type conducting. The use of a gold-arsenic alloy with an arsenic content of the gold-arsenic alloy of between 0.05 and 1.00% by weight is preferred for N-doped collector layers.

The second metallization layer 22 is made of titanium, the third 23 of nickel, and the fourth 24 of a binary or ternary gold-germanium alloy. The binary gold-germanium alloys preferably have a germanium content of between 4 and 20% by weight. Ternary gold-germanium alloys which may be used are those with boron or antimony as the third alloy constituent.

These layers may be manufactured through vapor deposition in high vacuum, for example by electron beam evaporation or cathode sputtering, or similar processes. After the first layer containing gold or aluminium has been provided, the wafer is subjected to a thermal treatment under reducing conditions. Gold or aluminium forms a eutectic of low melting point with silicon during this, and a low-ohmic contact is obtained.

When gold alloys with metals from the third group of the periodic system (B, Al, Ga or In) or with metals from the fifth group (P, As, Sb) are used, a doping of the pure semiconductor material silicon or germanium is achieved at the boundary layer. The gold component of the alloy joins itself to the Si or Ge to form the relevant eutectic during the thermal treatment. The other alloy metals dissolve into a layer of the semiconductor lattice of a previously calculated thickness, thus doping this layer. Such an additional doping improves the contact in the case of semiconductors with weakly doped collector zones.

Mounting on the carrier is usually effected through soldering, especially brazing. The carrier must also be provided with a solderable metal layer for this purpose. This soldering/brazing layer may comprise silver, gold, an Sn/Pb alloy, etc.

In the construction according to the invention, a metal system is provided which is indeed inhomogeneous, but which is nevertheless in a quasi-thermodynamic state of equilibrium. Oxidation through oxygen diffusion and an interdiffusion of the metals among themselves and with the semiconductor materials are suppressed thereby. The long-term behavior under a temperature load has thus been substantially improved. Accelerated life tests (ALT) showed an increase in product life compared with prior art semiconductor devices by a factor six to seven.

EXAMPLE 1

NPN transistor

The P- and N-type regions were made on the front side of an N-doped silicon substrate wafer in a known manner for the manufacture of NPN transistors. Then the rear side of the silicon substrate wafer was given a first layer of an AuAs alloy with an arsenic content of 0.4% by weight by vapor deposition. The AuAs layer had a thickness of 0.3 µm.

The substrate wafer thus metallized was subsequently given a heat treatment of 30 minutes at 420° C. After cooling down to room temperature, the surface of the AuAs metallization layer was cleaned through sputter-etching with argon ions so as to remove oxides and other impurities. Then a second layer of titanium with a thickness of 0.15 µm was deposited on the first metallization layer. This was followed by the deposition of a third layer of nickel of 0.25 µm thickness, and finally the deposition of a fourth layer of AuGe with a germanium content of 12% by weight and a thickness of 1.3 µm.

The silicon substrate wafer thus metallized was separated into individual chips with a diamond saw. The chips were soldered each to a silver-plated carrier. Semiconductor components were manufactured in this way which each comprised a discrete NPN transistor chip.

These NPN transistors have excellent electrical properties. The transistors showed a substantially improved long-term stability and a reduced reject rate in life tests. The contact resistance was still unchanged after 3,000 h in a high-temperature storage test at 150° C.

EXAMPLE 2

PNP transistor

The P- and N-type regions were made on the front side of a P-doped silicon substrate wafer in known manner for the manufacture of PNP transistors. The rear side of the silicon substrate wafer was then vapor-coated with a first gold layer. This Au layer had a thickness of 0.3 µm. The substrate wafer thus metallized was subsequently subjected to a heat treatment of 20 minutes at 430° C. After cooling down to room temperature, the surface of the Au metallization layer was cleaned through sputter etching with argon ions so as to remove oxides and other impurities. A second layer of titanium with a thickness of 0.15 µm was then deposited on the first metallization layer. This was followed by the deposition of a third layer of nickel with a thickness of 0.25 µm, and finally the deposition of a fourth layer of AuGe with a germanium content of 12% by weight and a thickness of 1.3 µm.

The silicon substrate wafer thus metallized was separated into individual chips with a diamond saw. The chips were soldered to a silver-plated carrier. Semiconductor components were manufactured in this way which each comprised a discrete PNP transistor chip.

These PNP transistors have excellent electrical properties. The transistors showed a substantially improved long-term stability and a reduced reject rate in life tests. The contact resistance was still unchanged after 3,000 h in a high-temperature storage test at 150° C.

EXAMPLE 3

PN diode

The P- and N-type regions were made on the front side of an N-doped silicon substrate wafer in known manner for the manufacture of PN diodes. The rear side of the silicon substrate wafer was then given a first layer of an AuAs alloy with an arsenic content of 0.4% by weight through vapor deposition. The AuAs layer had a layer thickness of 0.3 µm. The substrate wafer thus metallized was subsequently given a heat treatment of 30 minutes at 420° C. After cooling down to room temperature, the surface of the AuAs metallization layer was cleaned through sputter etching with argon ions so as to remove oxides and other impurites. Then a second layer of titanium with a thickness of 0.15 µm was deposited on the first metallization layer. This was followed by the deposition of a third layer of nickel with a thickness of 0.25 μm and finally the deposition of a fourth layer of AuGe with a germanium content of 12% by weight and a thickness of 1.3 μm.

The silicon substrate wafer thus metallized was separated into individual chips with a diamond saw. The chips were soldered to a silver-plated carrier. Semiconductor components were made in this way which each comprised a discrete PN diode chip.

These PN diodes have excellent electrical properties. The diodes showed a clearly improved long-term stability and a reduced reject rate in life tests. The contact resistance was still unchanged after 3.000 h in a high-temperature storage test at 150 ° C.

What is claimed is:

1. A semiconductor device, comprising:

a carrier, at least one semiconductor component on said carrier, and a multilayer metallization between the semiconductor component and the carrier, wherein said metallization includes a first metal layer of at least one of aluminum, gold, and a gold alloy on the surface of the semiconductor component, a second metal layer of titanium on the first metal layer, a third metal layer of nickel on the second metal layer, and a fourth metal layer of one of (i) binary or (ii) ternary gold-germanium alloy on the third metal layer.

2. A semiconductor device as claimed in claim 1, characterized in that the semiconductor component is a PNP transistor and the first metal layer is gold.

3. A semiconductor device as claimed in claim 2, characterized in that the first metal layer has a layer thickness of 0.1 to 0.5 μm, the second metal layer a layer thickness from 0.05 to 0.3 μm, the third metal layer a layer thickness from 0.05 to 0.5 μm, and the fourth metal layer a layer thickness from 0.5 to 5 μm in the semiconductor device.

4. A semiconductor device as claimed in claim 1, characterized in that the semiconductor component is an NPN transistor or a PN diode, and the first metal layer consists of a gold-arsenic alloy.

5. A semiconductor device as claimed in claim 4, characterized in that the first metal layer has a layer thickness of 0.1 to 0.5 μm, the second metal layer a layer thickness from 0.05 to 0.3 μm, the third metal layer a layer thickness from 0.05 to 0.5 μm, and the fourth metal layer a layer thickness from 0.5 to 5 μm in the semiconductor device.

6. A semiconductor device as claimed in claim 1, characterized in that the first metal layer has a layer thickness of 0.1 to 0.5 μm, the second metal layer a layer thickness from 0.05 to 0.3 μm, the third metal layer a layer thickness from 0.05 to 0.5 μm, and the fourth metal layer a layer thickness from 0.5 to 5 μm in the semiconductor device.

7. A semiconductor device, comprising:

a semiconductor component having a body of semiconductor material with a semiconductor lattice and a surface adjoining the lattice; and a multi layer metallization on said surface, said metallization comprising a first layer consisting of a gold alloy on said surface of said body;

a second metal layer consisting of titanium on said first metal layer;

a third metal layer consisting of nickel on said second metal layer, and a fourth metal layer consisting of one of (i) a binary and (ii) a ternary gold-germanium alloy on said third metal layer, and wherein said gold alloy of said first layer includes a metal selected from the group consisting of B, Al, Ga, In, P, As, and Sb, the gold of said gold alloy forms a eutectic joining the gold to the body of semiconductor material, and the metal selected from said group is distributed in said lattice, doping said lattice with the selected metal.

8. A semiconductor device according to claim 7, wherein said semiconductor material comprises one of Si and Ge.

9. A semiconductor as claimed in claim 8, characterized in that the semiconductor component is an NPN transistor or a PN diode, and the first metal layer consists of a gold-arsenic alloy.

10. A semiconductor device as claimed in claim 9, characterized in that the first metal layer has a layer thickness of 0.1 to 0.5 μm, the second metal layer a layer thickness from 0.5 to 0.3 μm, the third metal layer a layer thickness from 0.05 to 0.5 μm, and the fourth metal layer a layer thickness from 0.5 to 5 μm in the semiconductor device.

11. A semiconductor device as claimed in claim 7, characterized in that the first metal layer has a layer thickness of 0.1 to 0.5 μm, the second metal layer a layer thickness from 0.5 to 0.3 μm, the third metal layer a layer thickness from 0.05 to 0.5 μm, and the fourth metal layer a layer thickness from 0.5 to 5 μm in the semiconductor device.

* * * * *